(12) United States Patent
Rauchut et al.

(10) Patent No.: US 6,401,929 B2
(45) Date of Patent: *Jun. 11, 2002

(54) INSERT FOR USE IN TRANSPORTING A WAFER CARRIER

(75) Inventors: Joseph C. Rauchut, Harleysville; Gary J. Reichl, Coopersburg, both of PA (US); Noel L. Rodolfo, Boston, MA (US); James V. Roth, Jr., Emmaus, PA (US)

(73) Assignee: Agere Systems Guardian Corp., Orlando, FL (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/482,390

(22) Filed: Jan. 12, 2000

(51) Int. Cl.⁷ .............................................. B65D 85/00
(52) U.S. Cl. ...................... 206/710; 206/454; 211/41.18
(58) Field of Search ........................ 206/454, 709–711, 206/328, 334; 211/41.18

(56) References Cited

U.S. PATENT DOCUMENTS

| | | | | |
|---|---|---|---|---|
| 3,172,132 A | * | 3/1965 | Mucha | 206/449 |
| 4,779,732 A | * | 10/1988 | Boehm et al. | 206/454 |
| 5,255,797 A | * | 10/1993 | Kos | 211/41.18 |
| 5,273,159 A | * | 12/1993 | Gregerion | 206/711 |
| 5,346,518 A | * | 9/1994 | Baseman et al. | 206/711 X |
| 5,988,393 A | * | 11/1999 | Hsia et al. | 206/711 |
| 6,003,674 A | * | 12/1999 | Brooks | 206/711 |

OTHER PUBLICATIONS

Copy of Image of USPTO Shoe Insert.*
Dupont Delrin Acetal Resin, Product and Properties Guide, p. 1–15.
DuPont Engineering Polymers, Delrin Acetal Resin, p. 1–2.
Fluoroware, 150mm Wafer Handling, p. 1–2.
Fluoroware, Wafer Management, p. 1–2.
Fluoroware, Wafer Shipping, p. 1–2.
Flluoroware, Voyager Wafer Shipping Systems, p. 1–2.

* cited by examiner

*Primary Examiner*—Mickey Yu
*Assistant Examiner*—Jila M. Mohandesi
(74) *Attorney, Agent, or Firm*—Duane Morris LLP

(57) ABSTRACT

An assembly for storing semiconductor wafers includes a container, a wafer carrier and a plate. The container may be a box having a substantially rectangular bottom surface. The wafer carrier fits in the container. The wafer carrier has a plurality of slots. Each slot is capable of receiving a semiconductor wafer. The plate has a size and shape so as to snugly fit in a predetermined position in the container. The plate substantially prevents motion of the wafer carrier relative to the container. The plate may be an insert formed of a separate piece of material from the wafer carrier. The insert has a substantially rectangular shape so as to fit snugly on the bottom surface of the box. The insert has at least one mounting feature to snugly hold the wafer carrier. For example, the insert may have at least one groove shaped to receive a tab extending from a bottom of the wafer carrier. The insert may be formed of an acetyl homopolymer, polypropylene, polyethylene, or other soft plastic. In an alternative configuration, the plate may be integrally formed from the same piece of material as the wafer carrier.

2 Claims, 3 Drawing Sheets

10

INSERT FOR USE IN TRANSPORTING A WAFER CARRIER

FIELD OF THE INVENTION

The present invention relates generally to semiconductor fabrication, and more specifically to apparatus for storing and transporting semiconductor wafers.

DESCRIPTION OF THE RELATED ART

FIG. 1 shows a conventional assembly 10 for transporting semiconductor wafers 40. A container 20 has a box bottom 22 and a box cover 24. Inside the container 20 is a wafer carrier or cassette 30 that holds a plurality of semiconductor wafers 40. The wafer carrier 30 is a tray having a plurality of slots formed between adjacent pairs of ribs 34. Although only one pair of ribs 34 is visible in FIG. 1, one of ordinary skill understands that a plurality of ribs are arranged from front to back in planes parallel to the ribs 34 shown in FIG. 1. A respective slot is formed between each successive set of ribs 34. Each slot is capable of storing a respective wafer 40. Although only one wafer 40 is shown in FIG. 1, one of ordinary skill understands that a plurality of wafers are arranged from front to back in planes parallel to wafer 40. The box 20 with the wafer carrier 30 and wafers 40 inside may be transported between different processing stations, typically on wheeled carts.

The exemplary wafer carrier 30 also has right and left rearwardly projecting tabs 36 on its bottom, extending in a direction perpendicular to the plane of FIG. 1. A pair of stiffening ribs 38 are integrally formed at the front and rear ends of the wafer carrier 30. A structural cross member 32 is provided in the front of the wafer carrier 30, and a similar cross member is present in the back. The wafer carrier 30 is typically made from a carbon impregnated polypropylene material or similar material. Exemplary wafer carrier systems such as that shown in FIG. 1 are manufactured by Entegres, Inc., Chaska, Minn. (formerly Fluoroware, Inc.).

Because they contain a large number of wafers 40 in known positions, the wafer carriers 30 are useful in automated semiconductor processing. The wafers 40 can be automatically removed from the wafer carrier 30 for processing in an automated wafer processing system (not shown). For example, an ion implant system includes various wafer handling mechanisms for transferring semiconductor wafers into and out of the ion implanter. Some ion implant systems include a wafer clamp for transferring semiconductor wafers from the wafer carrier in which they are stored, onto an ion implanter disk. The wafer clamp grasps the wafer while it is disposed in the carrier, removes it from the carrier, and places it on the ion implanter disk.

Experience with wafer handling systems has shown that, after transport, upon removal from the wafer carrier, wafers often have an unacceptable number of contaminant particles on their surfaces. These contaminant particles interfere with the processing of the wafers.

An improved method and system for handling semiconductor wafers is desired.

SUMMARY OF THE INVENTION

One aspect of the invention is an insert for a container. The container is shaped to contain a wafer carrier during transport. The wafer carrier is shaped to hold a plurality of semiconductor wafers. The insert has a size and shape so as to snugly fit in a predetermined position in the container. The insert has at least one mounting feature to snugly hold the wafer carrier.

Another aspect of the invention is an assembly for storing semiconductor wafers, including: a container, a wafer carrier and a plate to which the wafer carrier is attached. The wafer carrier fits in the container. The wafer carrier has a plurality of slots, each slot capable of receiving a semiconductor wafer. The plate has a size and shape so as to snugly fit in a predetermined position in the container and substantially prevent movement of the wafer carrier relative to the container.

Another aspect of the invention is a method for handling at least one semiconductor wafer. an insert is snugly fitted in the bottom of a container. A wafer carrier is mounted on the insert. At least one semiconductor wafer is inserted in the wafer carrier. The container is transported with the insert, wafer carrier and at least one wafer contained therein.

The above and other features of the present invention will be better understood from the following detailed description of the exemplary embodiment of the invention which is provided in connection with the accompanying drawings.

DETAILED DESCRIPTION

The inventors have observed that, when using prior art wafer transport assemblies, particle formation during wafer transport is related to movement of the wafer carrier within the container. In many processing facilities, the floor of the building in which the processing equipment is located is not perfectly flat. Consequently, the wafer carrier and wafers are jostled about within the container. As the wafer carrier bumps into the inner walls of the container, small particles are released or abraded from the wafer carrier and adhere on the wafers themselves.

Figure 2:
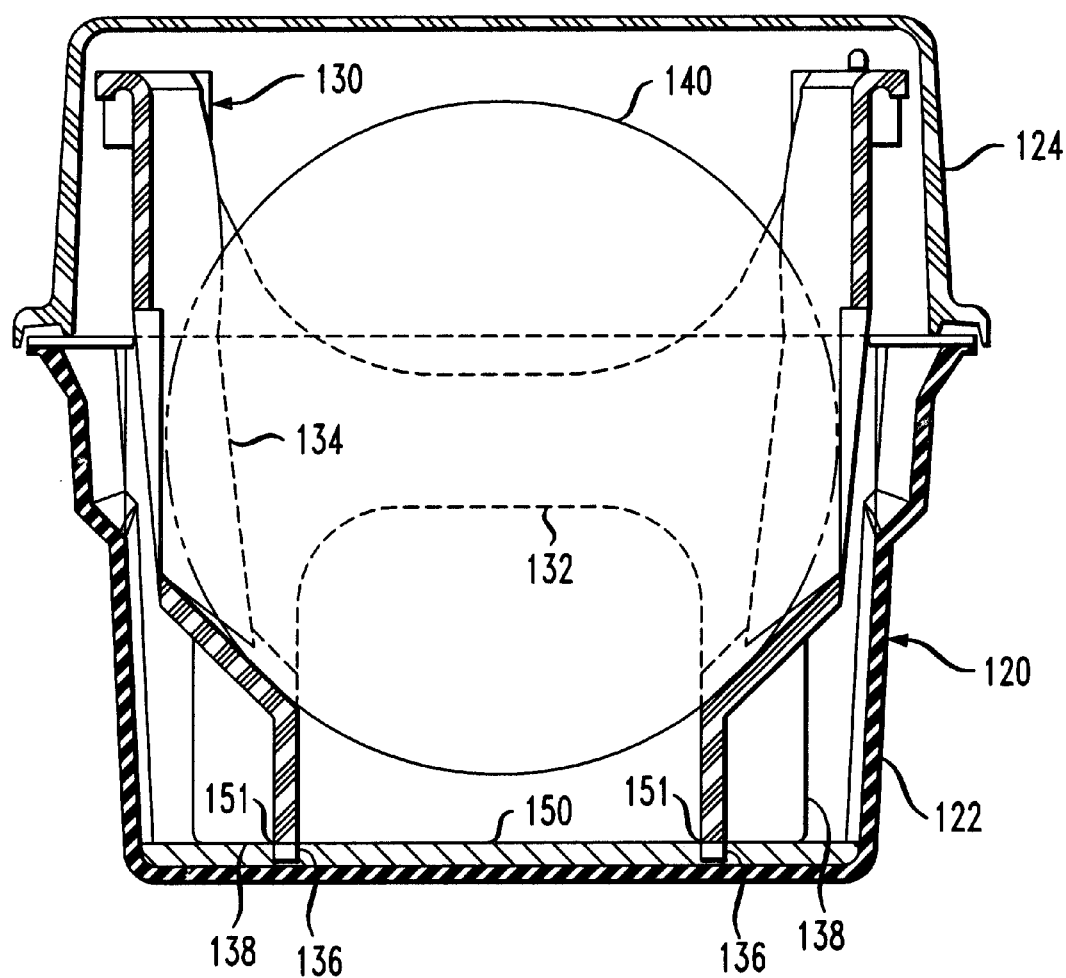
FIG. 2 is cross sectional view of a container and wafer carrier according to the present invention transporting semiconductor wafers.

FIG. 2 is a cross sectional view of an improved wafer transport assembly 100. The improved transport assembly 100 reduces and substantially eliminates movement of the wafer carrier 130 within the container 120 during transport. In particular, the addition of a plate (which may be an insert 150) causes the wafer carrier 130 to fit snugly within the container 120, reducing the motion.

In the exemplary embodiment, the insert 150 is a separate piece that can be retrofitted into an existing transport container 120 and wafer carrier 130 assembly. For any given container 120 and wafer carrier 130, an insert 150 may be designed to snugly fit into the container bottom 122, with a customized set of features (such as slots and wells) that closely matches any tabs, legs and/or projections on the bottom of the wafer carrier 130.

As shown in FIG. 2, a container 120 has a box bottom 122 and a box cover 124. Inside the container 120 is a wafer carrier 130 that holds a plurality of semiconductor wafers 140. The wafer carrier 130 is a tray having a plurality of slots formed between adjacent pairs of ribs 134. Although only one pair of ribs 134 is visible in FIG. 2, one of ordinary skill understands that a plurality of ribs are arranged from front to back in planes parallel to the ribs 134 shown in FIG. 2. A respective slot is formed between each successive set of ribs 134. Each slot is capable of storing a respective wafer 140. Although only one wafer 140 is shown in FIG. 2, one of ordinary skill understands that a plurality of wafers are arranged from front to back in planes parallel to wafer 140. The box 120 with the wafer carrier 130 and wafers 140 inside may be transported between different processing stations, typically on wheeled carts.

The exemplary wafer carrier 130 also has right and left downwardly projecting tabs 136 on its bottom, extending in a direction perpendicular to the plane of FIG. 2. A pair of stiffening ribs 138 are integrally formed at the front and rear ends of the wafer carrier 130. A structural cross member 132 is provided in the rear of the wafer carrier 130, and a similar cross member is present in the front. The wafer carrier 130 is typically made from a carbon impregnated polypropylene material or similar material. Exemplary wafer carriers 130 and containers 120 such as those shown in FIG. 2 are manufactured by Entegres, Inc., Chaska, Minn.

As shown in FIG. 2, the insert 150 has a pair of slots 151 that snugly receive the projecting tabs 136 of the wafer carrier 130. Thus, with the insert 150 in place, the wafer carrier 130 has no freedom of movement within the container 120.

Figure 3:
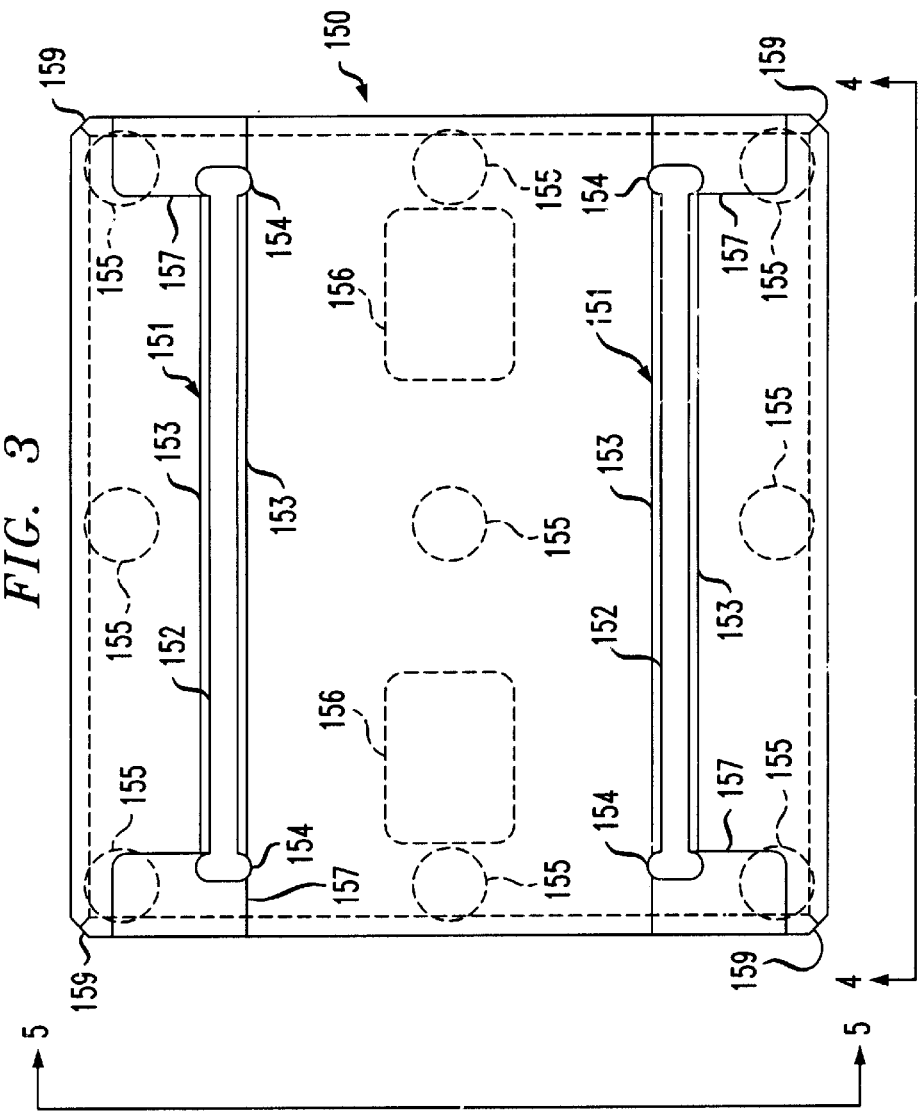
FIG. 3 is a top plan view of the insert shown in FIG. 2.
Figure 4:
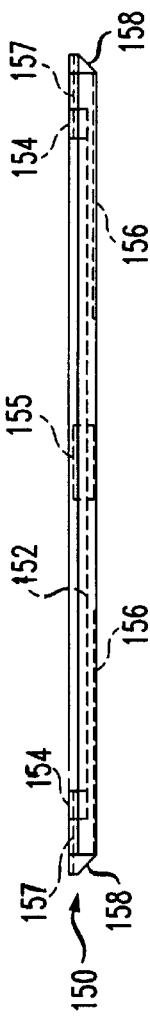
FIG. 4 is a front elevation view of the insert shown in FIG. 3.
Figure 5:
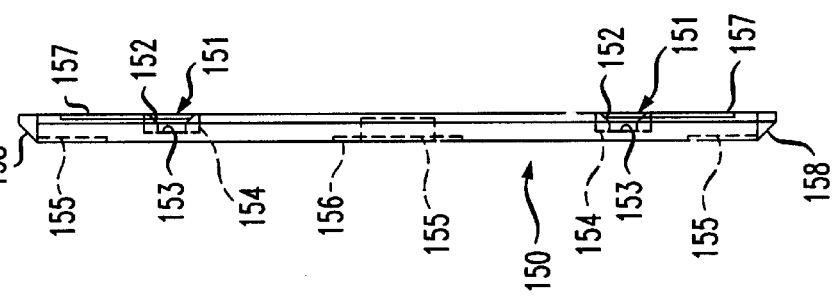
FIG. 5 is a side elevation view of the insert shown in FIG. 3.

FIGS. 3–5 show the exemplary insert 150, which is suitable for use in a "Entegres®" wafer transport assembly 120, 130, manufactured by Entegres Inc. of Chaska, Minn. The box bottom 122 has a substantially rectangular bottom surface, and the insert 150 has a substantially rectangular shape so as to fit snugly on the bottom surface of the box 122. The insert 150 has a pair of elongated grooves 151 for receiving the tabs 136 of the wafer carrier 130. Additional features of the grooves 151 include chamfers or bevels 153 which facilitate insertion of the tabs 136 into the main, snug fitting grooves 152. Each end of the grooves 151 includes a rounded cutout 154 for receiving a corresponding protuberance on the bottom of the wafer carrier 136.

In addition to the slots 151, the insert 150 has a variety of features for facilitating insertion. For example, all four sides of the insert 150 have chamfers or bevels 158, and all four corners have chamfers or bevels 159. Further, several small wells or bores 155, 156 and 157 are included in the insert, to accommodate specific pads and projections in the exemplary "Entegres®" box bottom 122.

The insert 150 may be formed from a variety of materials, including but not limited to an acetyl homopolymer, polypropylene, polyethylene and other soft plastics. Exemplary inserts 150 have been formed from white "DELRIN®" acetyl resin material, manufactured by the Dupont Corporation of Wilmington, Del., and from "ACETRON®" acetyl resin, manufactured by DSM Engineering Plastic Products, Inc., Reading, Pa. The material may be cut from sheet stock and machined, for example, using a numerically controlled milling machine.

Another aspect of the invention is a method for handling one or more semiconductor wafers. The method includes snugly fitting an insert 150 in the bottom of a container 120; mounting a wafer carrier 130 on the insert 150; inserting one or more semiconductor wafers 140 in the wafer carrier 130; and transporting the container 120, with the insert 150, wafer carrier 130 and the wafer(s) contained therein. Preferably, the method includes fitting at least one feature (such as a tab 136) of the wafer carrier 130 into a corresponding slot 151 in the insert 150.

Advantageously, the exemplary insert 150 is mounted in the container 120 without any tools, and the exemplary wafer carrier 130 is attached to the insert without any tools. By carefully selecting the size of the slot 151 (or other feature) to snugly fit the existing tabs 136 on the bottom of the wafer carrier 130, the insert 150 is attached by a simple press fit.

EXPERIMENTAL DATA

Figure 1:
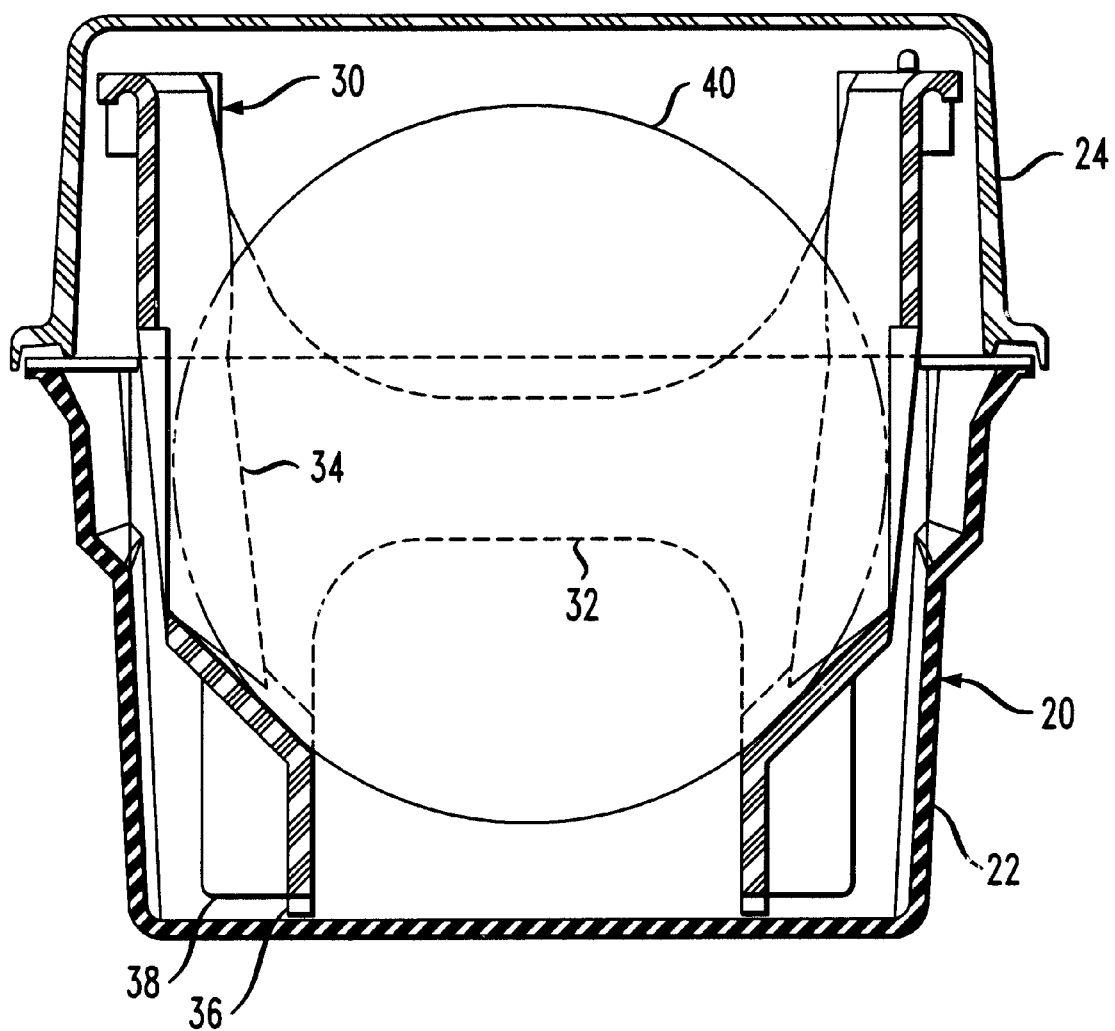
FIG. 1 is a cross sectional view of a conventional container and wafer carrier assembly for transporting semiconductor wafers.

Tables 1 and 2 provide comparative data for increase in the number of particles on semiconductor wafers during transport. The data were collected using a "SURFSCAN 6220" laser scanner to count the number of contaminant particles on each wafer. Table 1 includes data collected in a conventional wafer transport assembly as shown in FIG. 1. Table 2 includes data collected in a wafer transport assembly according to the invention, as shown in FIG. 2. In each table, the "pre-transport" column indicates the number of particles on the wafers before transport in the container and wafer carrier. The "post transport" column indicates the number of particles on the wafers after transport in the container and wafer carrier. The "gain" column (the difference between pre-transport and post-transport values) indicates the number of particles that adhere to each wafer during transport.

TABLE 1

PRIOR ART CONFIGURATION

| SLOT | PRE-TRANSPORT | POST-TRANSPORT | GAIN |
| --- | --- | --- | --- |
| 15 | 3 | 601 | 598 |
| 14 | 3 | 644 | 641 |
| 13 | 9 | 467 | 458 |
| 12 | 6 | 414 | 408 |
| 11 | 0 | 383 | 383 |

As demonstrated in Table 1, a significant number of particles adhered to each wafer during transport, as measured by the gain column. The average gain among the five wafers during transport was 498 particles per wafer.

TABLE 2

USING INSERT

| SLOT | PRE-TRANSPORT | POST-TRANSPORT | GAIN |
| --- | --- | --- | --- |
| 15 | 9 | 89 | 80 |
| 14 | 3 | 158 | 155 |
| 13 | 4 | 117 | 113 |
| 12 | 13 | 136 | 123 |
| 11 | 8 | 123 | 115 |

The data in Table 2 show a substantial reduction in the gain (number of particles that came adhered to each wafer during transport) compared to the average gain without the insert in the container. The average gain by each wafer when the insert was in place during transport was 117 particles per wafer. This represents a 76% reduction in particles that adhered to the wafers during transport, when compared to the data of table 1.

The data show a dramatic decrease (by a factor or four) in the number of particles when the insert was included.

OTHER EXEMPLARY VARIATIONS

Although the exemplary insert 150 has slots 152 to accommodate tabs 136 in the bottom of the wafer carrier 130, any feature on the bottom of the wafer carrier may be accommodated. For example, if a wafer carrier has slots on its bottom (not shown), a corresponding insert may have tabs or other projections to snugly fit into the slots of the bottom of the wafer carrier. Similarly, if the wafer carrier has a different number of tabs than the exemplary wafer carrier 130, the number of slots in the insert may be varied to accommodate the wafer carrier.

Although the exemplary insert is symmetrical (and capable of insertion in either of two positions rotated 180 degrees apart from each other), an insert may alternatively be keyed, so that it can only fit inside the box bottom 122 in a single position.

Although the exemplary embodiment of the invention includes a separate insert to be added to an existing assembly including a container 120 and a wafer carrier 130, other embodiments are also contemplated. For example, the wafer carrier and "insert" may be formed (e.g., molded) from a single piece of material. This single body would include a plurality of slots for receiving wafers, like conventional wafer carriers. In addition, the body would have a bottom plate shaped like the insert described above with reference to FIGS. 2–5. The bottom plate would be integrally attached to the bottom of the wafer carrier. The bottom plate would conform to the shape of the box bottom 122 of the container 120, and would have a perimeter shaped to snugly fit within the perimeter of the box bottom 122.

Although the exemplary insert is rectangular, to fit a rectangular container, the insert (or plate) may have any shape to fit a non-rectangular container.

Although the invention has been described in terms of exemplary embodiments, it is not limited thereto. Rather, the appended claim should be construed broadly, to include other variants and embodiments of the invention which may be made by those skilled in the art without departing from the scope and range of equivalents of the invention.

What is claimed is:

1. An assembly for storing semiconductor wafers, comprising:

a container, said container being substantially box-shaped and having a bottom surface and four side walls;

a wafer carrier that fits in the container, the wafer carrier having a plurality of slots, each slot capable of receiving a semiconductor wafer;

a removable insert to which the wafer carrier is attached, the insert being formed from a piece of material separate and distinct from the container, the insert having four side walls which snugly fit against four side walls of the container, said insert substantially preventing motion of the wafer carrier relative to the container, and wherein said wafer carrier is mounted to said insert, and wherein the container is a box having a rectangular bottom surface, and wherein the insert has a rectangular shape with four corners, and wherein the four side walls of the insert snugly fit against the four side walls of the container, and wherein the insert has at least one groove shaped to receive a tab extending from a bottom of the wafer carrier, and wherein the insert is formed of one of the group consisting of an acetyl homopolymer, polypropylene, and polyethylene, and wherein the corners and the side walls of the insert have chamfers or bevels for easier insertion into the container, and wherein the insert includes wells or bores to accommodate projections on a bottom of the container.

2. The assembly of claim 1, further comprising a plurality of wafers, and wherein the insert does not contact the plurality of wafers held in the wafer carrier.

* * * * *